(12) United States Patent
Lee et al.

(10) Patent No.: US 7,746,966 B2
(45) Date of Patent: Jun. 29, 2010

(54) METHOD FOR AUTOMATIC GAIN CONTROL BEFORE INITIAL SYNCHRONIZATION IN OFDM SYSTEM AND APPARATUS THEREOF

(75) Inventors: Yong-Su Lee, Daejeon (KR); Youn-Ok Park, Daejeon (KR); Jun-Woo Kim, Daejeon (KR); Young-Jo Bang, Daejeon (KR)

(73) Assignees: Samsung Electronics Co., Ltd. (KR); Electronics and Telecommunications Research Institute (KR); KT Corporation (KR); SK Telecom Co., Ltd. (KR); KTFreetel Co., Ltd. (KR); Hanaro Telecom, Inc. (KR)

( * ) Notice: Subject to any disclaimer, the term of this patent is extended or adjusted under 35 U.S.C. 154(b) by 611 days.

(21) Appl. No.: 11/791,442

(22) PCT Filed: Jun. 24, 2005

(86) PCT No.: PCT/KR2005/001980
§ 371 (c)(1),
(2), (4) Date: May 23, 2007

(87) PCT Pub. No.: WO2006/059829
PCT Pub. Date: Jun. 8, 2006

(65) Prior Publication Data
US 2008/0056394 A1 Mar. 6, 2008

(30) Foreign Application Priority Data
Nov. 30, 2004 (KR) ................ 10-2004-0099146

(51) Int. Cl.
*H04L 27/08* (2006.01)

(52) U.S. Cl. .............. 375/345; 375/260; 375/340; 375/362; 455/232.1; 455/234.1; 455/234.2; 455/245.1; 370/509

(58) Field of Classification Search ........ 375/345, 375/260, 340, 362; 455/232.1, 234.1, 234.2, 455/245.1; 370/509
See application file for complete search history.

(56) References Cited

U.S. PATENT DOCUMENTS 6,574,292 B2    6/2003 Heinonen et al.

(Continued)

FOREIGN PATENT DOCUMENTS

| JP | 1020020090562 A | 12/2002 |
|---|---|---|
| JP | 2003-008676 | 1/2003 |
| JP | 100451709 B1 | 9/2004 |

*Primary Examiner*—Phuong Phu
(74) *Attorney, Agent, or Firm*—The Farrell Law Firm, LLP

(57) ABSTRACT

The present invention relates to a method for automatic gain control (AGC) before an initial synchronization of a mobile station modem in OFDM system, and an apparatus thereof. The AGC apparatus includes: an initial synchronization inspector that verifies whether an initial synchronization for an input block sample (k) signal has been performed; a frame divider that divides a frame into predetermined intervals B(k) for the input block sample(k) signal in the case that the initial synchronization has not been performed; a reference value inspector that compares a difference value Pref−Pcalc, between a predetermined reference value Pref and sample data average energy Pcalc, with a predetermined value; a count controller that increases or decreases the count when the difference value Pref−Pcalc compared by the reference value inspector is greater or less than the predetermined value; a count inspector that inspects whether the count is greater or less than 0 when the input block sample (k) reaches a maximum value MAX; and a gain controller which increases or decreases the gain, level by level, according to the count inspection result of the count inspector.

16 Claims, 5 Drawing Sheets

U.S. PATENT DOCUMENTS

| | | |
|---|---|---|
| 6,782,063 B1 | 8/2004 | Stevenson et al. |
| 7,251,282 B2 * | 7/2007 | Maltsev et al. .............. 375/260 |
| 7,295,517 B2 * | 11/2007 | Anim-Appiah et al. ..... 370/232 |
| 7,457,366 B2 * | 11/2008 | Maltsev et al. .............. 375/260 |
| 2001/0055350 A1 | 12/2001 | Higure |
| 2002/0090042 A1 | 7/2002 | Heinonen et al. |
| 2002/0118779 A1 | 8/2002 | Wu et al. |
| 2005/0101264 A1 * | 5/2005 | Farlow et al. ................. 455/84 |

* cited by examiner

METHOD FOR AUTOMATIC GAIN CONTROL BEFORE INITIAL SYNCHRONIZATION IN OFDM SYSTEM AND APPARATUS THEREOF

TECHNICAL FIELD

The present invention relates to a method for automatic gain control before an initial synchronization in an orthogonal frequency division multiplexing (OFDM) system, and an apparatus thereof, and more particularly relates to a method for automatic gain control before an initial synchronization of a mobile station modem in an OFDM system.

BACKGROUND ART

Generally, automatic gain control (AGC) has been sequentially performed only in a training symbol interval in an OFDM system.

A preamble of the IEEE 802.11a in the OFDM system includes short training symbols (Short Training Sequence) and long training symbols (Long Training Sequence). The short training symbol is utilized for signal recognition, automatic gain control, and coarse frequency offset estimation, and the long training symbol is utilized for fine symbol synchronization acquisition and fine frequency offset estimation.

An energy value of a data symbol is not constant because the data symbol is a result of Inverse Fast Fourier Transform (IFFT) for arbitrary data, compared with a training symbol in which electric power is normalized. For this reason, AGC needs to be performed by using training symbols in the preamble interval.

An AGC device of a general OFDM system measures energy of data, calculates its average value, transforms the average value into a dB value to be compensated, and performs feedback on a difference between the average value and the reference value to thus perform a gain control in the training symbol.

Reference electric power is an important parameter in gain control. Bit error rates (BER) of the OFDM system can be reduced, according to the value of the reference electric power, while gain control is performed. That is, the performance of the OFDM system depends on the reference electric power.

In the OFDM system, after the initial synchronization of the mobile station modem, AGC can be performed by frames using a preamble of a predetermined interval because a preamble is provided right after a synchronization signal.

However, neither a start point of the preamble nor a presence of the signal can be found before an execution of the initial synchronization. Also, Evaluation of the entire energy of a frame causes too much load for the hardware, and therefore there is a disadvantage in that two engines for before-initial synchronization and after-initial synchronization need to be provided independently.

As a prior art, Korean Patent Application No. 10-2001-29456, filed on May 28, 2001 discloses the invention entitled "Automatic gain control device of orthogonal frequency division multiplexing (OFDM) signal and an automatic gain control method using the device".

In the OFDM transmission method using a repeated preamble for high-speed packet transmission, the above mentioned invention discloses an AGC device which detects a signal by monitoring signal power, and controls a signal gain rapidly and stably in the shortest time at the moment in which the signal is detected, in order to maintain an opt imal signal level for an analog/digital converter (ADC) input terminal.

It is not difficult to synchronize, without exact AGC, when there is no signal distortion in a good channel condition, but AGC must be performed to some degree when signal intensity is very weak due to a bad channel condition.

However, the prior invention has the disadvantage in that the device may not operate in a continuously bad channel condition since the device performs AGC after the signal is detected and only passively detects the signal in the same condition.

As to another prior art, U.S. Pat. No. 6,574,292 (filed on Jan. 17, 2002) discloses an invention entitled "Automatic gain control methods and apparatus suitable for use in OFDM receivers".

More particularly, the above-noted invention discloses two stages of AGC method, which has a first stage of performing AGC by using a sample in the time domain and a second stage of performing AGC in the frequency domain.

However, the invention needs additional hardware for determining which stage of AGC method is to be performed, and has a disadvantage in that a gain value does not converge into an accurate value and errors occur since the invention performs AGC with two threshold values, which are a maximum threshold value and a minimum threshold value.

Hereafter, a conventional AGC method of the OFDM system will be described referring to FIG. 1 and FIG. 2.

FIG. 1 is a flowchart showing a conventional operation process of the AGC method by collecting samples in the time domain.

FIG. 2 is a flowchart showing a conventional operation process of the AGC method by collecting samples in the frequency domain.

The conventional AGC method of the OFDM system performs AGC in the time domain using a sample, and then performs AGC in the frequency domain using a sample.

Referring to FIG. 1, the AGC method includes measuring a signal level X of a sample in the time domain in step S101, determining whether the measured signal level X is greater than a maximum threshold value 1 in step S102, and decreasing the gain as much as A dB in step S103 when the measured signal level X is found to be greater than the maximum threshold value 1, and then the process returns to the previous step S101. Herein, the A dB is an arbitrary value, so it can be given appropriately.

The method includes determining whether the measured signal X is less than a minimum threshold value 1 in step S104 when the measured signal level X is not greater than the maximum threshold value 1, and increasing the gain as much as A dB in step S105 when the measured signal level X is found to be less than the minimum threshold value 1, and then the process returns to the previous step S101.

The method includes fixing the gain to a predetermined value in step S106 when the measured signal level X is not greater than the maximum threshold value 1, and also, is not less than the minimum threshold value 1, and then returning to step S101.

Referring to FIG. 2, the conventional AGC method in the frequency domain includes transforming the sample of the time domain into a sample of the frequency domain in step S201, and selecting appropriate tones in step S202.

The above mentioned AGC method includes measuring a signal level Y of the sample in the frequency domain in step S203, and measuring an error e in step S204. The error e is generated by subtracting a reference value from the signal level Y.

The method includes evaluating an average value of the error e in step S205, and determining whether the signal level Y is greater than a maximum threshold value 2 in step S206.

The gain is decreased as much as A dB in step S207, when the signal level Y is greater than the maximum threshold value 2, and the process returns to step S201.

The method includes determining whether the signal level Y is less than a minimum threshold value 2 in step S208 when the measured signal level Y is not greater than the maximum threshold value 2. The gain is increased as much as A dB in step S209 when the case that the signal level Y is less than the minimum threshold value 2, and the process returns to step S201.

The gain is fixed in step S210 when the signal level Y is not greater than the maximum threshold value 2, and also, is not less than the minimum threshold value 2, and then the process returns to step S201.

However, the method shown in FIG. 1 and FIG. 2 needs additional hardware for determining which stage will be used for AGC between the first stage of the time domain and the second stage of the frequency domain. Furthermore, the method has the disadvantage that the gain value does not converge into an accurate value and errors occur because the invention performs AGC with two threshold values, which are a maximum threshold value and a minimum threshold value.

The information disclosed in this Background Art interval is only for enhancement of understanding of the background art, and therefore, unless explicitly described to the contrary, it should not be taken as an acknowledgement or any form of suggestion that this information forms the prior art that is already known in this country to a person of ordinary skill in the art.

DISCLOSURE OF INVENTION

Technical Problem

The present invention has been made in an effort to provide an automatic gain control method and device before performance of an initial synchronization of a mobile station modem in an OFDM system.

The advantage of the present invention is to provide a method and an apparatus for AGC, which enable a fine AGC without any additional hardware, even before the initial synchronization, by operating an engine that is the same as that of the after initial synchronization.

Technical Solution

According to an exemplary embodiment of the present invention, an apparatus for automatic gain control (AGC) of a mobile station in an orthogonal frequency division multiplexing (OFDM) system includes an initial synchronization inspector, a frame divider, a reference value inspector, a count controller, a count inspector, and a gain controller.

Herein, the initial synchronization inspector verifies whether an initial synchronization for an input block sample (k) signal has been performed.

The frame divider divides a frame into predetermined intervals B(k) for the input block sample (k) signal in the case that the initial synchronization has not been performed.

The reference value inspector compares a difference value Pref–Pcalc, between a predetermined reference value Pref and sample data average energy Pcalc, with a predetermined value.

The count controller increases or decreases a count when the difference value Pref–Pcalc compared by the reference value inspector is greater or less than the predetermined value.

The count inspector inspects whether the count is greater or less than 0 when the input block sample (k) has reached a maximum value MAX.

The gain controller increases or decreases the gain, level by level, according to the count inspection result of the count inspector.

In another embodiment, the apparatus for AGC starts AGC at an arbitrary point among the divided predetermined intervals B(k), by using an engine that is also used after the initial synchronization, in the case that the initial synchronization has not been performed.

In a further embodiment, when the initial synchronization has not been performed, the gain controller operates the engine for AGC in each interval and performs AGC for each frame level by level, according to the number of times in which signal intensity exceeds a threshold during one frame.

In a still further embodiment, the count controller increases the count by one when the difference value Pref–Pcalc is less than the predetermined value. Herein, the predetermined value can be given as 3 dB.

In a still further embodiment, the gain controller decreases the gain by one level when the count is greater than 0, and increases the gain by one level when the count is less than 0.

According to an exemplary embodiment of the present invention, a method for AGC of a mobile station in an OFDM system includes the below steps a), b), c), d), e), f), and g).

Step a) includes inspecting whether an initial synchronization has been performed for an input block sample (k) signal.

Step b) includes dividing a frame into predetermined intervals B(k) for the input block sample (k) signal in the case that the initial synchronization has not been performed.

Step c) includes comparing a difference value Pref–Pcalc, between a predetermined reference value Pref and a sample data average energy Pcalc, with a predetermined value.

Step d) includes increasing or decreasing a count when the compared difference value Pref–Pcalc is greater or less than the predetermined value.

Step e) includes inspecting whether the count is greater or less than 0 when the input block sample (k) has reached a maximum value MAX.

Step f) includes decreasing the gain by one level when the count inspection result of the count inspector is greater than 0.

Step g) includes increasing the gain by one level when the count inspection result of the count inspector is less than 0.

In another embodiment, step a) starts AGC at an arbitrary point among the divided predetermined intervals B(k), by using an engine that is also used after the initial synchronization, in the case that the initial synchronization has not been performed.

In a further embodiment, step a) operates the engine for AGC in each interval and performs AGC for each frame, level by level, according to the number of times in which signal intensity exceeds a threshold during one frame, when the initial synchronization has not been performed.

In a still further embodiment, in step a), the input block sample (k) signal is a signal of which the gain is initialized to a middle value when power is applied.

In a further embodiment, step a) divides a frame of the input block sample (k) signal into the predetermined interval B(k) and starts AGC at an arbitrary interval among the predetermined intervals.

In a further embodiment, step c) further includes c-1), c-2), and c-3).

Step c-1) includes initializing the input block sample (k) and the count parameter.

Step c-2) includes calculating the average energy Pcalc of the block and increasing k by one.

Step c-3) includes inspecting whether the difference value Pref−Pcalc, between the reference value Pref and the calculated average energy Pcalc, is greater or less than the predetermined value.

Herein, step c-3) returns to step c-2) when the difference value Pref−Pcalc is greater than the predetermined value, and calculates the average energy of the next block and again inspects whether the difference value Pref−Pcalc is greater or less than the predetermined value.

In a further embodiment, step d) increases the count parameter by one when the difference value Pref−Pcalc is less than the predetermined value.

In a further embodiment, step e) calculates the average energy of the next block and inspects whether the difference value Pref−Pcalc is greater or less than the predetermined value when the parameter k has not reached the maximum value MAX.

Advantageous Effects

The exemplary embodiment of the present invention divides a frame into the predetermined intervals B(k), and operates the engine for AGC in each interval by using the engine that is also used after the initial synchronization, and performs AGC for each frame, level by level, according to the number with signal intensity that exceeds the threshold during a frame.

Even before the initial synchronization, the present invention uses the engine that is also used after the initial synchronization, without any additional hardware, and controls the gain value to converge into an accurate value. Therefore the present invention enables a fine AGC.

Additional features of the invention will be set forth in the description which follows, and in part will be apparent from the description, or may be learned by practice of the invention.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

BEST MODE FOR CARRYING OUT THE INVENTION

Figure 1:
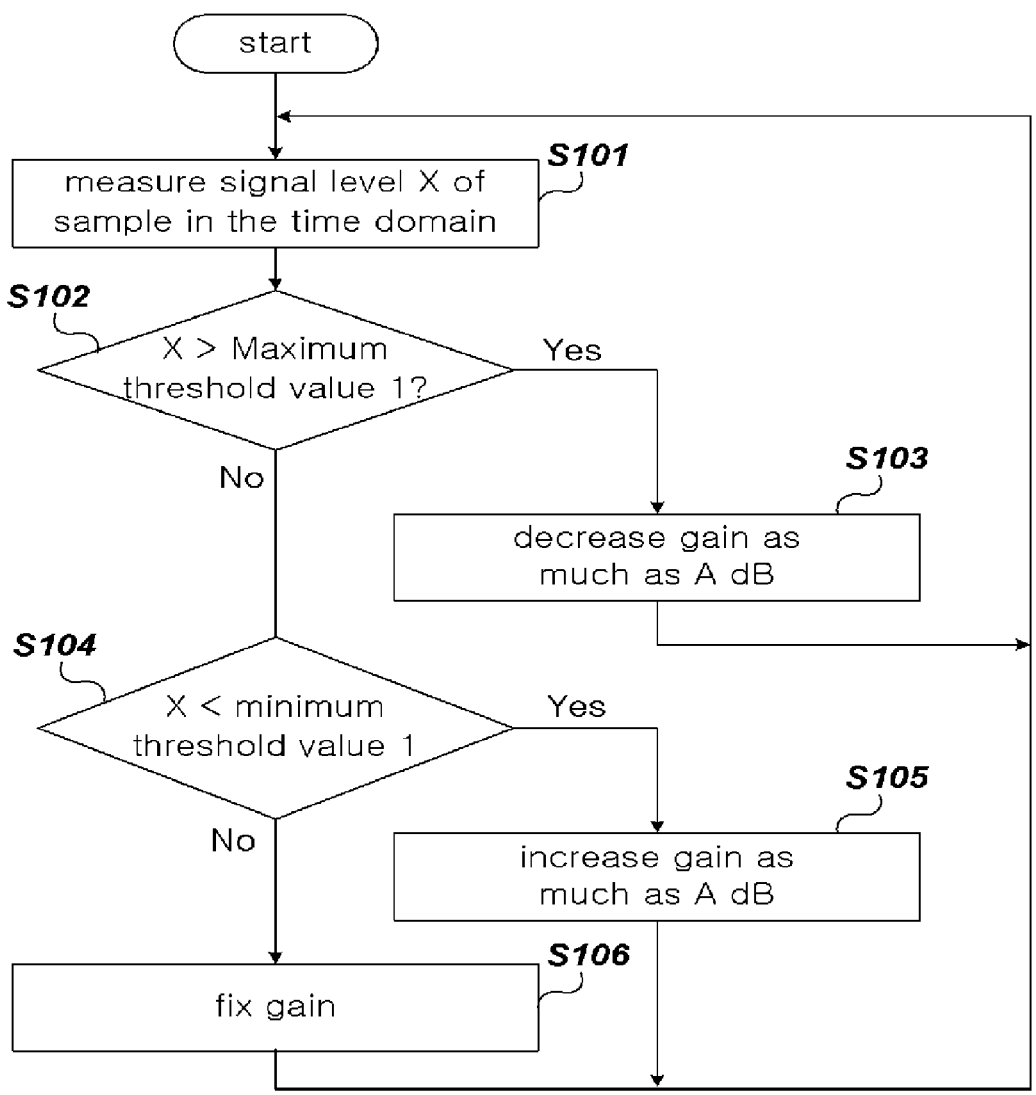
FIG. 1 is a flowchart showing a conventional operation process of the AGC method by collecting samples in the time domain.
Figure 2:
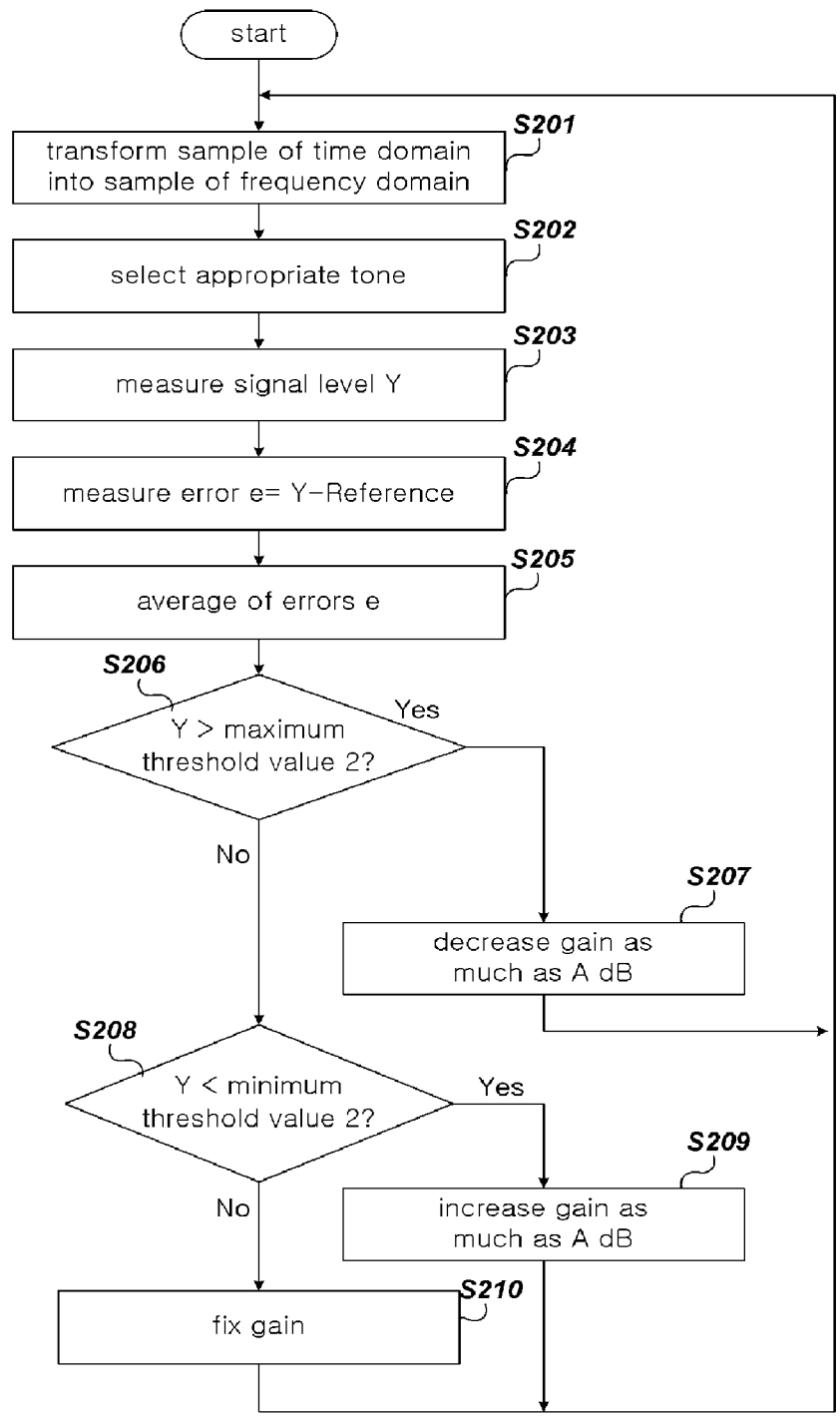
FIG. 2 is a flowchart showing a conventional operation process of the AGC method by collecting samples in the frequency domain.

In the following detailed description, exemplary embodiments of the present invention are shown and described, simply by way of illustration. As those skilled in the art would recognize, the described exemplary embodiments may be modified in various ways, all without departing from the spirit or scope of the present invention. Accordingly, the drawings and description are to be regarded as illustrative in nature, rather than restrictive.

In the drawings, illustrations of elements having no relation with the present invention are omitted in order to more clearly present the subject matter of the present invention. In the specification, the same or similar elements are denoted by the same reference numerals even though they are depicted in different drawings.

An AGC method before an initial synchronization in an OFDM system and an apparatus thereof, according to the exemplary embodiments of the present invention, will now be described in detail with reference to the annexed drawings.

Figure 3:
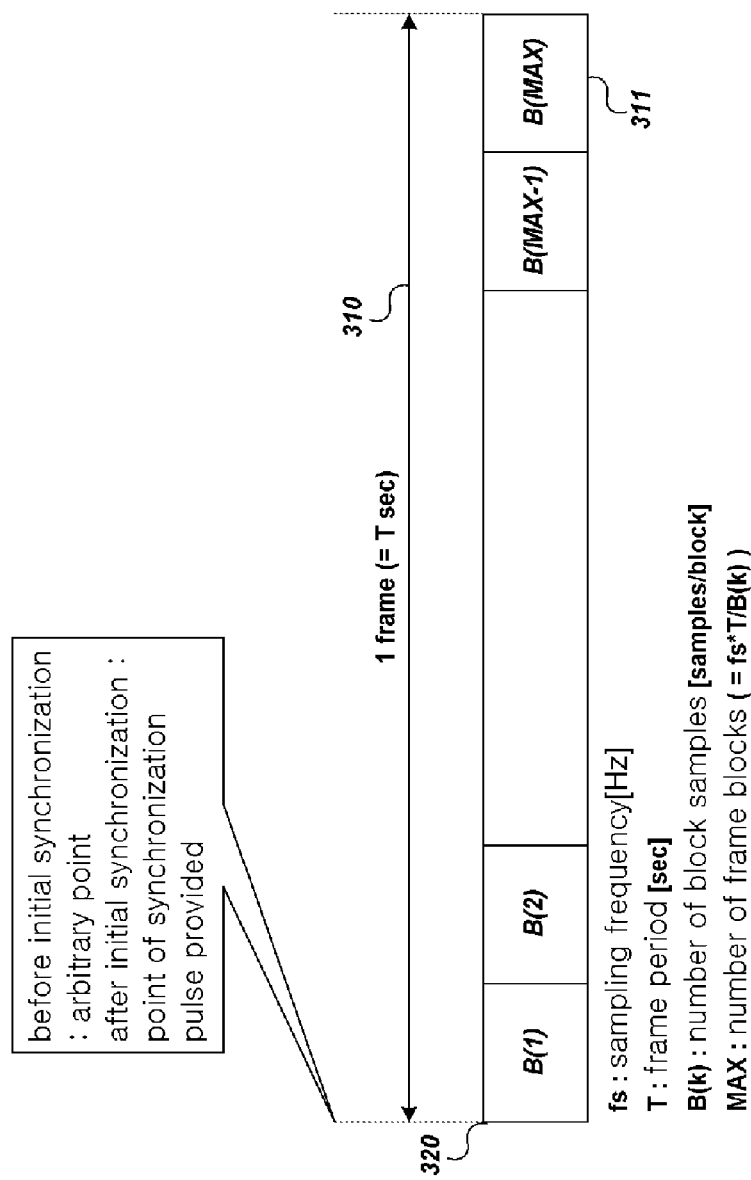
FIG. 3 is a diagram showing a frame structure, blocks, and a relation among parameters in a general OFDM system.

FIG. 3 is a diagram showing a frame structure, blocks, and a relation among parameters in a general OFDM system.

Referring to FIG. 3, a frame 310 includes k block samples 311 B(1) to B(MAX). MAX is the number of frame blocks, and is given as fs*T/B(k). Herein, fs indicates a sampling frequency, T indicates a frame period, B(k) indicates the number of block samples. The reference numeral 320 indicates an arbitrary point before the initial synchronization, whereas, after the initial synchronization, it indicates a point at which a synchronization pulse is provided.

Generally, AGC is performed by using training symbols of a preamble interval.

In the OFDM system, AGC can be performed frame by frame using preamble data of a predetermined interval B(1) because the preamble is provided following a synchronization signal after the initial synchronization of a mobile station modem. However, neither a start point of the preamble nor a presence of the signal can be found before the initial synchronization.

When there is a signal before the initial synchronization, there obviously exists a signal in a downlink interval during a frame.

Therefore, an exemplary embodiment of the present invention divides a frame into the predetermined intervals B(k), and operates an engine for AGC in each interval, using the engine that is also used after the initial synchronization, and performs AGC for each frame, level by level, according to the number of times in which signal intensity exceeds the threshold during a frame.

Figure 4:
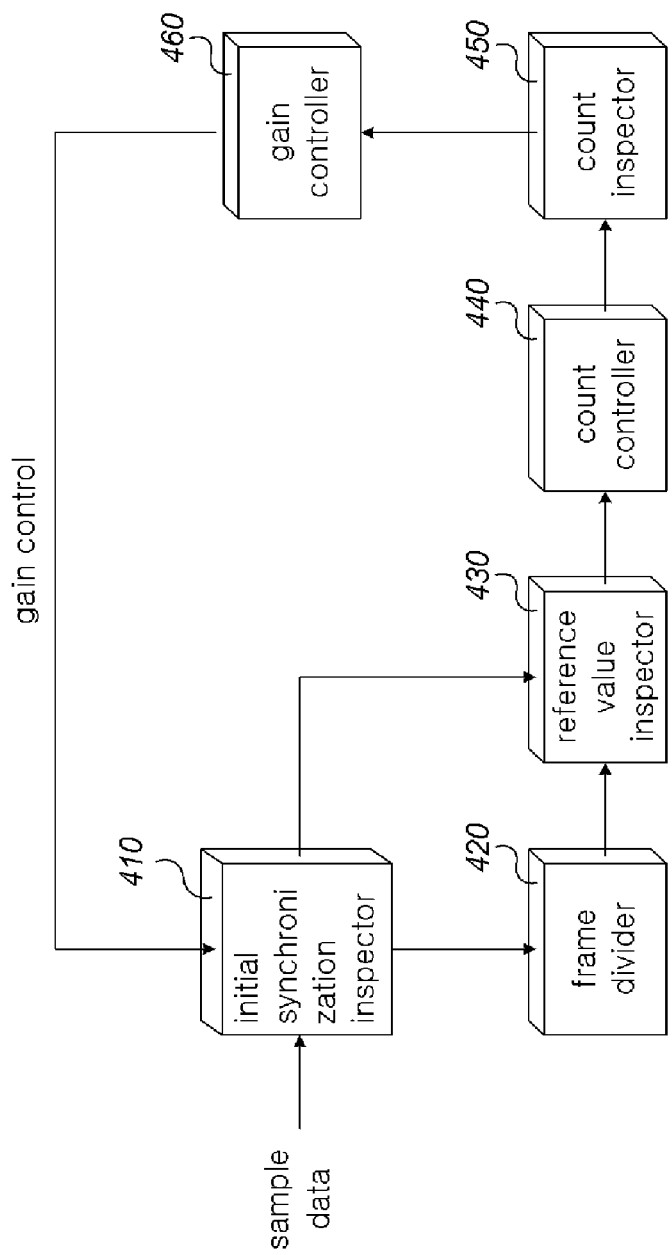
FIG. 4 is a schematic diagram showing an AGC apparatus before an initial synchronization in a general OFDM system according to an exemplary embodiment of the present invention.

FIG. 4 is a schematic diagram for the AGC apparatus before the initial synchronization in the general OFDM system according to exemplary embodiment of the present invention. The AGC apparatus includes an initial synchronization inspector 410, a frame divider 420, a reference value inspector 430, a count controller 440, a count inspector 450, and a gain controller 460.

Referring to FIG. 4, in the AGC apparatus before the initial synchronization, the initial synchronization inspector 410 verifies whether an input sample signal is synchronized initially. The AGC is operated when the initial synchronization has been performed. On the other hand, the AGC apparatus divides a frame into the predetermined intervals B(k), and operates an engine for AGC in each interval by using the engine that is also used after the initial synchronization, and performs AGC for each frame, level by level, according to the number of times in which signal intensity exceeds the threshold during a frame when the initial synchronization has not been performed yet.

The frame divider 420 divides a frame of the input block sample (k) signal into predetermined intervals B(k) when the initial synchronization has not been performed yet.

The reference value inspector 430 compares a predetermined reference power, which is a difference value (Pref−Pcalc) between a reference value Pref and a sample data average energy Pcalc, with a predetermined value. For example, the difference value Pref−Pcalc can be given as 3 dB.

The reference value Pref can be given as Equation 1.

$$P_{ref} = 2\sigma^2 \quad \text{Equation 1}$$
$$\sigma = Q_{max} / \text{SR\_RATIO}$$
$$Q_{max} = 2^{N-1}$$
$$N = ADC \text{ bit resolution}$$

where N is given as a bit resolution of an analog/digital converter, and the reference power Pref is given as $2^2$.

The OFDM system according to the embodiment of the present invention uses the reference power Pref for AGC. Herein, a signal to noise ratio SR_RATIO is an important parameter in calculating the reference power Pref.

The count controller 440 increases or decreases a count when the difference value Pref−Pcalc compared by the reference value inspector 440 is greater or less than 3 dB. Actually, the count controller 440 increases the count by one only when the difference value Pref−Pcalc is less than 3 dB.

As shown in FIG. 3, the count inspector 450 inspects whether the count is greater or less than 0 when the input block sample (k) has reached MAX.

The gain controller 460 increases or decreases gain, level by level, according to the count inspection of the count inspector 440. Actually, the gain controller 460 decreases the gain by one level when the count is greater than 0, and increases the gain by one level when the count is less than 0.

Therefore, in the case that the initial synchronization has not been performed yet, the apparatus divides a frame into the predetermined intervals B(k), and operates the engine for AGC in each interval, and performs AGC for each frame, level by level, according to the number with signal intensity that exceeds the threshold during a frame.

Figure 5:
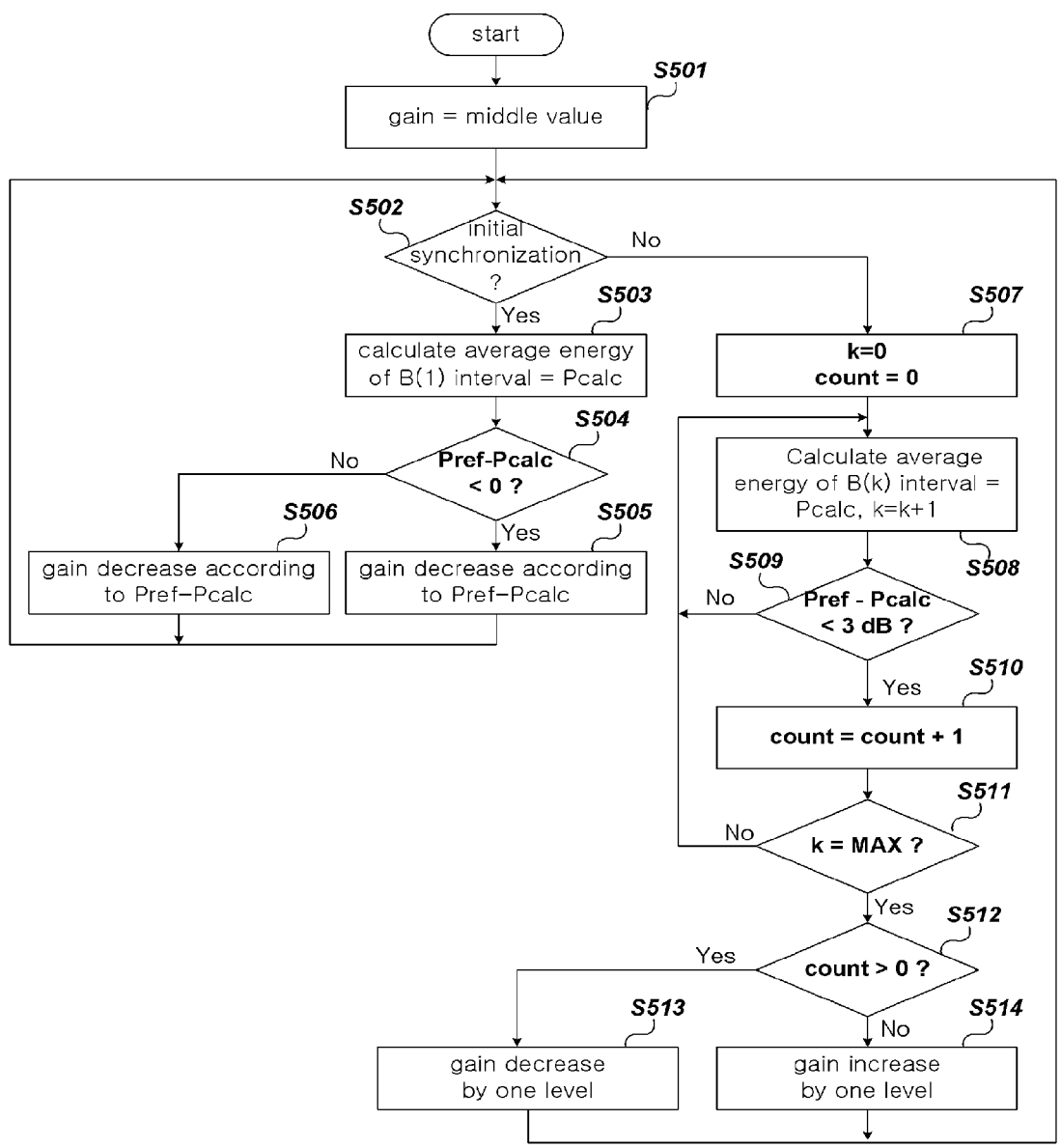
FIG. 5 is a flowchart showing an operation process of an AGC method before and after an initial synchronization in an OFDM system according to an exemplary embodiment of the present invention.

FIG. 5 is a flowchart showing the operation process of the AGC method before and after the initial synchronization in the OFDM system according to the present invention.

Referring to FIG. 5, the AGC method before and after the initial synchronization in the OFDM system initializes the gain to a middle value in step S501 when the power is on, and inspects whether the synchronization is finished in step S502.

In the case that the initial synchronization has been finished, a B(1) interval is positioned at the point that is right after the synchronization pulse is imposed as shown in FIG. 3.

The method calculates the average energy Pcalc of the sample data in the B(1) interval in step S503 and verifies whether the sign of the reference power determined by Equation 1, which is the difference value Pref−Pcalc between the reference value Pref and the average energy Pcalc, is positive or negative in step S504, and controls the gain appropriately in accordance with the result of step S504.

The method decreases the gain appropriately on the basis of the difference value Pref−Pcalc in step S505 when the difference value Pref−Pcalc is negative, and increases the gain appropriately on the basis of the difference value Pref−Pcalc in step S506 when the difference value Pref−Pcalc is positive.

In step S502, in the case that the initial synchronization has not been finished yet, AGC starts at an arbitrary point. In detail, the method divides a frame of the input block sample (k) signal into the predetermined intervals B(k) and starts AGC at an arbitrary interval among the predetermined intervals.

The method initializes the input block sample (k) and the count parameter, in other words, it establishes that k=0 and count=0 in step S507, and calculates the average energy Pcalc of the block and increases k by one in step S508.

The method inspects whether the difference value Pref−Pcalc, between the reference value Pref and the calculated average energy Pcalc, is greater or less than 3 dB in step S509.

In the case that the difference value Pref−Pcalc is greater than 3 dB, the method returns to step S508 and calculates the next average energy and again inspects whether the difference value Pref−Pcalc is greater or less than 3 dB.

In the case that the difference value Pref−Pcalc is less than 3 dB, the method increases the count parameter as count+1 in step S510.

The method inspects whether the parameter k has reached the maximum value MAX in step S511. In the case that the parameter k has not reached the maximum value MAX, the method returns to step S508 and calculates the next average energy and again inspects whether the difference value Pref−Pcalc is greater or less than 3 dB.

In the case that the parameter k has reached the maximum value MAX, the method inspects whether the count is greater than 0 in step S512. In the case that the count is greater than 0, the method decreases the gain by one level in step S513, and returns to S502 and inspects the initial synchronization again. In the case that the count is less than 0, the method increases the gain by one level in step S514, and returns to S502 and inspects the initial synchronization again.

Consequently, the exemplary embodiment of the present invention divides a frame into the predetermined intervals B(k), and operates the engine for AGC in each interval by using the engine that is also used after the initial synchronization, and performs AGC for each frame, level by level, according to the number with signal intensity that exceeds the threshold during a frame.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

Even before the initial synchronization, the present invention uses the engine that is also used after the initial synchronization without any additional hardware, and controls the gain value to converge into an accurate value. Therefore the present invention enables a fine AGC.

The invention claimed is:

1. An apparatus for automatic gain control (AGC) of a mobile station in an orthogonal frequency division multiplexing (OFDM) system, comprising;
    an initial synchronization inspector that determines whether an initial synchronization for an input block sample signal (k) has been performed;
    a frame divider that divides a frame into predetermined intervals B(k) for the input block sample (k) signal when the initial synchronization has not been performed;
    a reference value inspector that compares a difference value Pref−Pcalc, between a predetermined reference value Pref and sample data average energy Pcalc, with a predetermined value;

a count controller that increases or decreases a count when the difference value Pref−Pcalc is greater or less than the predetermined value;

a count inspector which inspects whether the count is greater or less than 0 when the input block sample (k) has reached a maximum value MAX; and a gain controller which increases or decreases the gain, level by level, according to the count inspection result of the count inspector.

2. The apparatus for AGC of claim 1, wherein the apparatus starts AGC at an arbitrary point among the divided predetermined intervals B(k) by using an engine that is used after the initial synchronization when the initial synchronization has not been performed.

3. The apparatus for AGC of claim 1, wherein the gain controller operates the engine for AGC in each interval and performs AGC for each frame, level by level, according to the number of times in which signal intensity exceeds a threshold during a frame in the case that the initial synchronization has not been performed.

4. The apparatus for AGC of claim 1, wherein the count controller increases the count by one when the difference value Pref−Pcalc is less than the predetermined value.

5. The apparatus for AGC of claim 3, wherein the predetermined value is given to be 3dB.

6. The apparatus for AGC of claim 1, wherein the gain controller decreases the gain by one level when the count is greater than 0.

7. The apparatus for AGC of claim 1, wherein the gain controller increases the gain by one level when the count is less than 0.

8. A method for automatic gain control (AGC) of a mobile station in an orthogonal frequency division multiplexing (OFDM) system, comprising;
   a) inspecting whether an initial synchronization has been performed for an input block sample (k) signal;
   b) dividing a frame into predetermined intervals B(k) for the input block sample(k) signal in the case that the initial synchronization has not been performed;
   c) comparing a difference value Pref−Pcalc, between a predetermined reference value Pref and a sample data average energy Pcalc, with a predetermined value;
   d) increasing or decreasing a count when the compared difference value Pref−Pcalc is greater or less than the predetermined value;
   e) inspecting whether the count is greater or less than 0 when the input block sample (k) has reached a maximum value MAX;
   f) decreasing the gain by one level when the count inspection result of the count inspector is greater than 0; and
   g) increasing the gain by one level when the count inspection result of the count inspector is less than 0.

9. The method for AGC of claim 8, wherein a) comprises: starting AGC at an arbitrary point among the divided predetermined intervals B(k) by using an engine that is used after the initial synchronization in the case that the initial synchronization has not been performed.

10. The method for AGC of claim 8, wherein a) comprises: operating the engine for AGC in each interval and performs AGC for each frame, level by level, according to the number of times in which signal intensity exceeds a threshold during a frame in the case that the initial synchronization has not been performed.

11. The method for AGC of claim 8, wherein in the a), the input block sample (k) signal is a signal of which the gain is initialized to a middle value when power is applied.

12. The method for AGC of claim 8, wherein a) comprises: dividing a frame of the input block sample (k) signal into the predetermined intervals B(k) and starting AGC at an arbitrary interval among the predetermined intervals.

13. The method for AGC of claim 8, wherein the c) further comprises;
   c-1) initializing the input block sample (k) and the count parameter;
   c-2) calculating the average energy Pcalc of the block and increasing k by one;
   c-3) inspecting whether the difference value Pref−Pcalc, between the reference value Pref and the calculated average energy Pcalc, is greater or less than the predetermined value.

14. The method for AGC of claim 13, wherein c-3) comprises: returning to c-2) when the difference value Pref−Pcalc is greater than the predetermined value, and calculating the average energy of the next block and again inspecting whether the difference value Pref−Pcalc is greater or less than the predetermined value.

15. The method for AGC of claim 8, wherein d) comprises: increasing the count parameter by one when the difference value Pref−Pcalc is less than the predetermined value.

16. The method for AGC of claim 8, wherein e) comprises: calculating the average energy of the next block and inspects whether the difference value Pref−Pcalc is greater or less than the predetermined value when the parameter k has not reached the maximum value MAX.

* * * * *